United States Patent [19]

Vermilyea

[11] Patent Number: 4,853,663

[45] Date of Patent: Aug. 1, 1989

[54] PASSIVE SHIMS FOR CORRECTION OF (3,2) AND (3,-2) HARMONIC TERMS IN MAGNETIC RESONANCE MAGNETS

[75] Inventor: Mark E. Vermilyea, Schenectady, N.Y.

[73] Assignee: General Electric Company, Schenectady, N.Y.

[21] Appl. No.: 288,346

[22] Filed: Dec. 22, 1988

[51] Int. Cl.$^4$ ............................................. H01F 7/00
[52] U.S. Cl. ........................................... 335/301; 324/320
[58] Field of Search ............... 335/214, 216, 299, 301, 335/304; 324/318, 319, 320

[56] References Cited

U.S. PATENT DOCUMENTS

| | | | |
|---|---|---|---|
| 4,698,611 | 10/1987 | Vermilyea | 335/301 X |
| 4,743,853 | 5/1988 | Frese | 335/301 X |
| 4,771,243 | 9/1988 | Vreugdenhil et al. | 335/299 |

FOREIGN PATENT DOCUMENTS 59-60346  4/1984  Japan .................. 335/301

Primary Examiner—George Harris
Attorney, Agent, or Firm—William H. Steinberg; James C. Davis, Jr.; Paul R. Webb, II

[57] ABSTRACT

A shim set for passively shimming (3,2) and (3,−2) harmonic terms in the field of the magnetic resonance magnet having a cylindrical bore, is provided. Four shims of ferromagnetic material, all of the same size, are secured to the interior of the bore of the magnet. The length of each of the shims is greater than its width. The first two of the shims are secured diametrically opposite one another, near one end of the magnet, with the length of the shims extending circumferentially. One of the first two shims is situated so that a polar angle is created between the axial centerline of the cylindrical bore and an imaginary line extending through the center of the cylindrical bore and the center of the shim, at about 30°-44° with 38° being the most desirable location. The second two of the four shims are positioned symmetrically about the axial midplane of the cylindrical bore from the first two of the four shims and rotated 90° circumferentially relative to the first two shims.

12 Claims, 6 Drawing Sheets

[4,853,663]

PASSIVE SHIMS FOR CORRECTION OF (3,2) AND (3,-2) HARMONIC TERMS IN MAGNETIC RESONANCE MAGNETS

BACKGROUND OF THE INVENTION

The present invention relates to passive shimming of magnetic resonance magnets to improve magnetic field homogeneity in the bore of the magnet and more particularly, passive shims for creating desired combinations of (3,2) and (3-2) harmonic terms.

Obtaining good quality magnetic resonance images requires a main static magnetic field with high field homogeneity throughout the imaging volume of the magnet. The field homogeneity varies from magnet to magnet because of deviations of the magnetic windings from a specified shape and position due to manufacturing variations. In addition, the presence of ferromagnetic material (such as building structural supports) in the vicinity of the magnet can degrade image quality obtained during a scan.

The magnetic field in the bore of a magnet can be represented as a series of spherical harmonics expanded about the origin of the magnet coordinate system with one of the harmonic terms having no spatial variation and representing the desired constant field. The origin of the coordinate system is situated at a central point in the magnet bore. The spherical harmonics are represented as (n,m) where n is the degree and m is the order of the spherical harmonic space. The elimination of harmonics other than the harmonic representing the constant uniform field would increase the overall homogeneity of the field.

Correction coils are typically used to improve the magnetic field homogeneity. The correction coils are specially shaped windings situated in the bore of the magnet, capable of creating different field shapes associated with the unwanted harmonics. The field shapes created by the correction coils can be superimposed on the inhomogeneous main field to perturb the main field in a manner to increase the overall field uniformity. Each correction coil typically has its own power supply to provide the correct current flow to the coil windings to produce the desired amount of the compensating field shape to cancel the existing field shape in the magnet.

Some early magnets, which are still being used, do not have correction coils for the (3,2) and (3,-2) terms in the spherical harmonic expansion of the magnetic field. A design to eliminate these harmonics using passive shims has been proposed by the Oxford Magnet Technology Co. (OMT) and is shown in FIG. 1. This design, however, introduces a high level of high order harmonic contaminants, much more than the design of the present invention. High order field terms cannot usually be removed by the correction coils of the magnets since the number of correction coils are limited in number and only correct lower order harmonics. If the (3,2) and (3,-2) harmonic terms can be eliminated without introducing higher order harmonics, which cannot be compensated for, the field homogeneity and therefore the image quality can be improved.

It is an object of the present invention to provide a simple and reliable means for creating an arbitrary combination of (3,2) and (3,-2) harmonic terms without the creation of higher order harmonic contaminants.

SUMMARY OF THE INVENTION

In one aspect of the present invention a shim set for passively shimming (3,2) and (3,-2) harmonic terms in the field of the magnetic resonance magnet having a cylindrical bore, is provided. Four shims of ferromagnetic material, all of the same size, are secured to the interior of the bore of the magnet. The length of each of the shims is greater than its width. The first two of the shims are secured diametrically opposite one another, near one end of the magnet, with the length of the shims extending circumferentially. One of the first two shims is situated so that a polar angle is created between the axial centerline of the cylindrical bore and an imaginary line extending through the center of the cylindrical bore and the center of the shim, at about 30–44° with 38° being the most desirable location. The second two of the four shims are positioned symmetrically about the axial midplane of the cylindrical bore from the first two of the four shims and rotated 90° circumferentially relative to the first two shims.

BRIEF DESCRIPTION OF THE DRAWING

The subject matter which is regarded as the invention is particularly pointed out and distinctly claimed in the concluding portion of the specification. The invention, however, both as to organization and method of practice, together with further objects and advantages thereof, may best be understood by reference to the following description taken in conjunction with the accompanying figures in which:

DETAILED DESCRIPTION OF THE INVENTION

Figure 2:
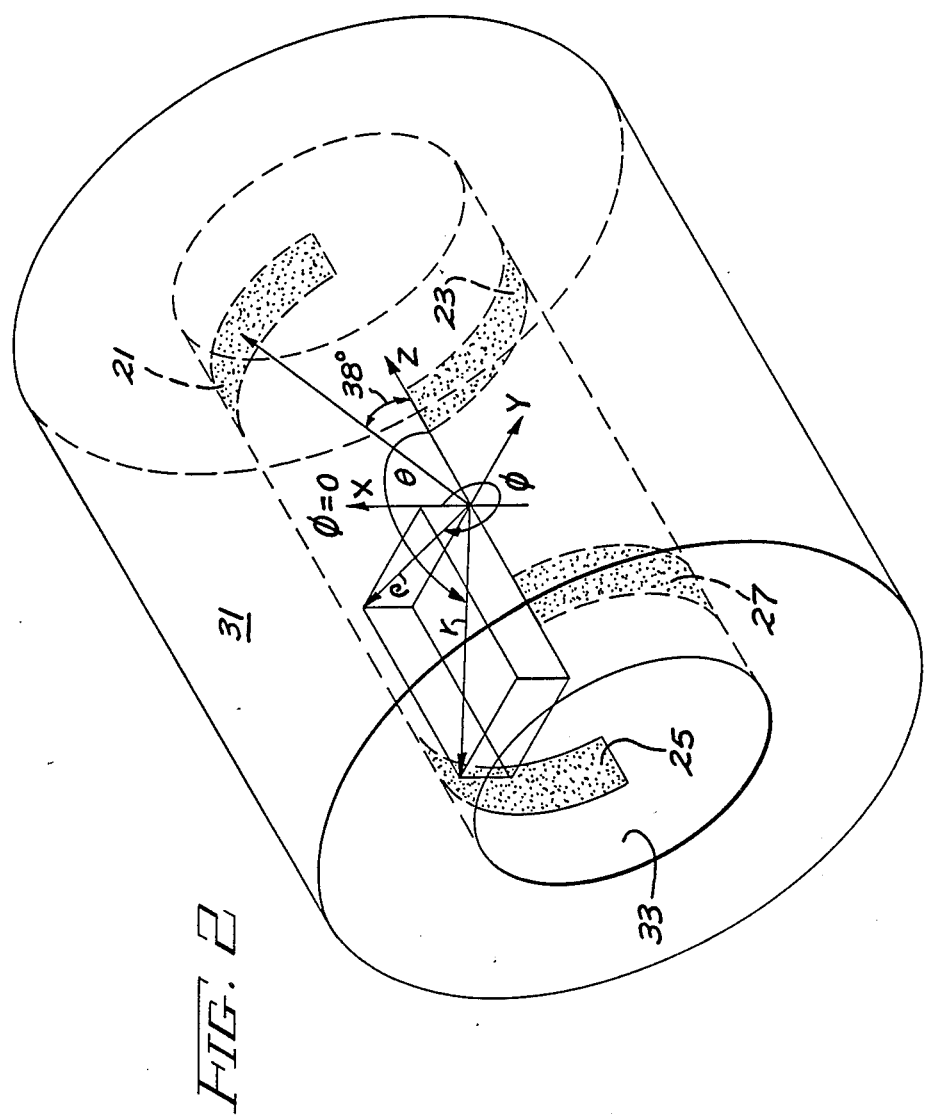
FIG. 2 is an isometric view of four shims positioned in accordance with one embodiment of the present invention in the bore of a cylindrical magnet, with the cylindrical magnet shown in outline form.

Referring now to FIG. 2, retrofit shims are provided comprising four steel rectangular sheets 21, 23, 25 and 27 which are secured in the cylindrical bore of a magnetic resonance magnet 31. The shims can be secured by adhesive tape or glue. Glue, such as silicone adhesives, which permits the shims to be removed by peeling are preferred. The shims can create an arbitrary combination of (3,2) and (3,−2) harmonic terms. The magnet is assumed to have electromagnetic correction coils (not shown).

The shims 21, 23, 25 and 27 are shown in a position in the bore 33 of the magnet 31 for producing the (3,2) harmonic without the (3,−2) harmonic, with the shim 21 having its center located at the top of the cylindrical bore interior. The magnet 31 can be of the superconducting type with a bore length of 180 cm., and a radius of 46 cm. and a field strength of 1.5 Tesla, for example. The shim 21 is shown at a polar angle of 38° measured between the axial centerline of the cylindrical bore 33 and the center of the rectangular shim 21. A polar angle of about 38° is the most desirable location, although a range of about 30–44° is acceptable. The rectangular shim has its longest dimension extending circumferentially in the interior of the bore. Each of the shims subtend an angle of 90°. In a cylindrical bore having a radius of 46 cm., the polar angle of 38° results in the center of the shim being at an axial position of 58 cm. measured from the center of the cylindrical bore along the axial centerline. Shim 23 is situated diametrically opposite shim 21 with both shims the same distance from the center of the cylindrical bore. Shims 25 and 27 are positioned with axial symmetry about the axial midplane of the cylindrical bore but rotated azimuthally by 90°. The polar angle, axial symmetry and the 90° rotation azimuthally between shim pairs 21 and 23, and 25 and 27 remain fixed with the simultaneous rotation of all the shims to new positions. This rotation in shim locations controls the relative amount of (3,2) and (3,−2) harmonic terms generated. Changes in the thickness of the four shims controls the magnitude of the (3,2) and (3,−2) terms created by the shims when subjected to a magnetic field.

When providing retrofit passive shims for MR magnets to compensate for selected harmonic terms which cannot be satisfactorily dealt with by the existing shimming system, it is desirable to have the shims create only those terms which are needed to be superimposed on the existing field to cancel the undesirable harmonics. The retrofit shims, however, in addition to producing the desired harmonics needed for cancellation also produce other harmonics as well. If the unwanted harmonics produced are of an order and strength which cannot be compensated for by the existing magnet correction coil, then the additional harmonics will be an impediment to achieving improved overall field homogeneity.

The magnet 31 has correction coils (not shown) which can shim the following harmonic terms (n,m) (0,0), (1,0), (2,0), (3,0), (4,0), (1,1), (1,−1), (2,1), (2,−1), (3,1), (3,−1), (2,2), and (2,−2), where n and m are indices representing the Legendre polynominal order and degree, respectively, in the harmonics field equation.

$$B_n^m(r_0, \theta_0, \phi_0) = \tag{1}$$

$$\begin{cases} A_n^m\, r_0^n\, P_n^m(\cos\theta_0)\cos(m\phi_0) & \text{for } m = 0, 1, 2 \ldots \\ A_{|n^m|}\, r_0^n\, P_n^m(\cos\theta_0)\sin(|m|\phi_0) & \text{for } m = -1, -2, \ldots \end{cases}$$

where $B_n^m$ is the magnetic flux density of the term (n,m) at field point $(r_0, \theta_0, \phi_0)$, $A_n^m$ is the magnitude coefficient, and $P_n^m$ is the associated Legendre polynomial of order n and degree m. The subscript o in equation (1) when used with spherical coordinate system parameters means the point at which the field is being evaluated. The reason for the correction coil (0,0) is to adjust the magnetic field strength in the magnet, which in a superconducting magnet can drift.

A spherical coordinate system with parameters $r, \theta, \phi$ is shown embedded in a right-handed Cartesian coordinate system having the parameters x,y,z in FIG. 2. The origin for both coordinate systems is the center of the cylindrical bore of the magnet. The z axis extends axially through the bore of the magnet, with the axial midplane at z=0.

A point P in the magnet bore has a radius vector r which is measured from an origin 0. The vector has a length of r. A polar angle $\phi$ lies in the r-z plane and is the angle between the z axis and the radius r. If the radius r is projected into the x-y plane, a vector $\rho$ is obtained having a length shown by the following equation:

$$\rho = r\cos(90-\theta) = r\sin\theta \tag{2}$$

The azimuthal angle $\theta$ lies in the x-y plane and is the angle between the x-axis and the vector $\rho$. The relationship between the Cartesian and spherical harmonics is given by:

$$z = r\cos\theta \tag{3}$$

$$x = (r\sin\theta)\cos\phi \tag{4}$$

$$y = (r\sin\theta)\sin\phi \tag{5}$$

In order not to introduce certain terms in the field produced by the shims when they are subjected to a magnet field, certain symmetries are employed in positioning the shims. The four shim pieces are disposed axially symmetrically about the axial magnet midplane at z=0 and the azimuthal locations of the two shims in each end of the magnet in the interior of the cylinder bore are 180° apart. Further, the azimuthal locations of the shims in one end of the magnet are displaced 90° from those in the other end. Since the shims are located on the interior surface of a cylinder the azimuthal extent of the shims is the same as their circumferential extent. Shims to produce a (3,2) term appear as in FIG. 2. To produce a (3,−2) term all the shims are rotated through an azimuthal angle of 90° with the mathematically positively rotation being clockwise when looking in the positive z direction. A mixture of (3,2) and (3,−2) terms are obtained by rotating four shims between 0° and 90° azimuthally, which is discussed further hereinafter.

The symmetries discussed above reduce the harmonic terms created by the shims to the even or odd orders (n) as shown below with the following harmonic degrees (m):

| degree m | order n |
| --- | --- |
| 0 | even |
| 2 | odd |
| 4 | even |
| 6 | odd |
| 8 | even |
| . | . |
| . | . |

Another design choice allows removal of harmonic degrees of m=4 from the field created by the four shims when subjected to a magnetic field. This design choice is the circumferential extent of each shim. A $\Delta\phi$ of 90° eliminates the m=4 terms. The magnitude of m=6 terms generated by the shims producing the typically required amounts of (3,2) and (3,−2) terms in general is negligible. The important terms to reduce are those with m=4 for n≧4 and m=2 for n≧3 and n=0 for n≧6. Additional values to be determined are the axial location and width of the individual pieces.

In determining shim axial placement in the present invention, the primary error terms were minimized relative to the desired term. The three principle contaminating fields are created by (5,2), (6,0), (8,0) terms which cannot be reduced by correction coils or symmetries. Each of these three terms were evaluated at their maximum on an imaginary sphere of 25 centimeter radius, centered in the bore of the magnet, with a shim set with a fixed axial width of 10 centimeter and with a shim set with a fixed axial width of 1 centimeter and the symmetries previously described for a variety of axial shim positions. An axial width of 10 centimeters was selected to achieve the typically required strengths of the (3,2) term of 5ppm with a reasonable shim thickness of under 30 mils.

Figure 3:
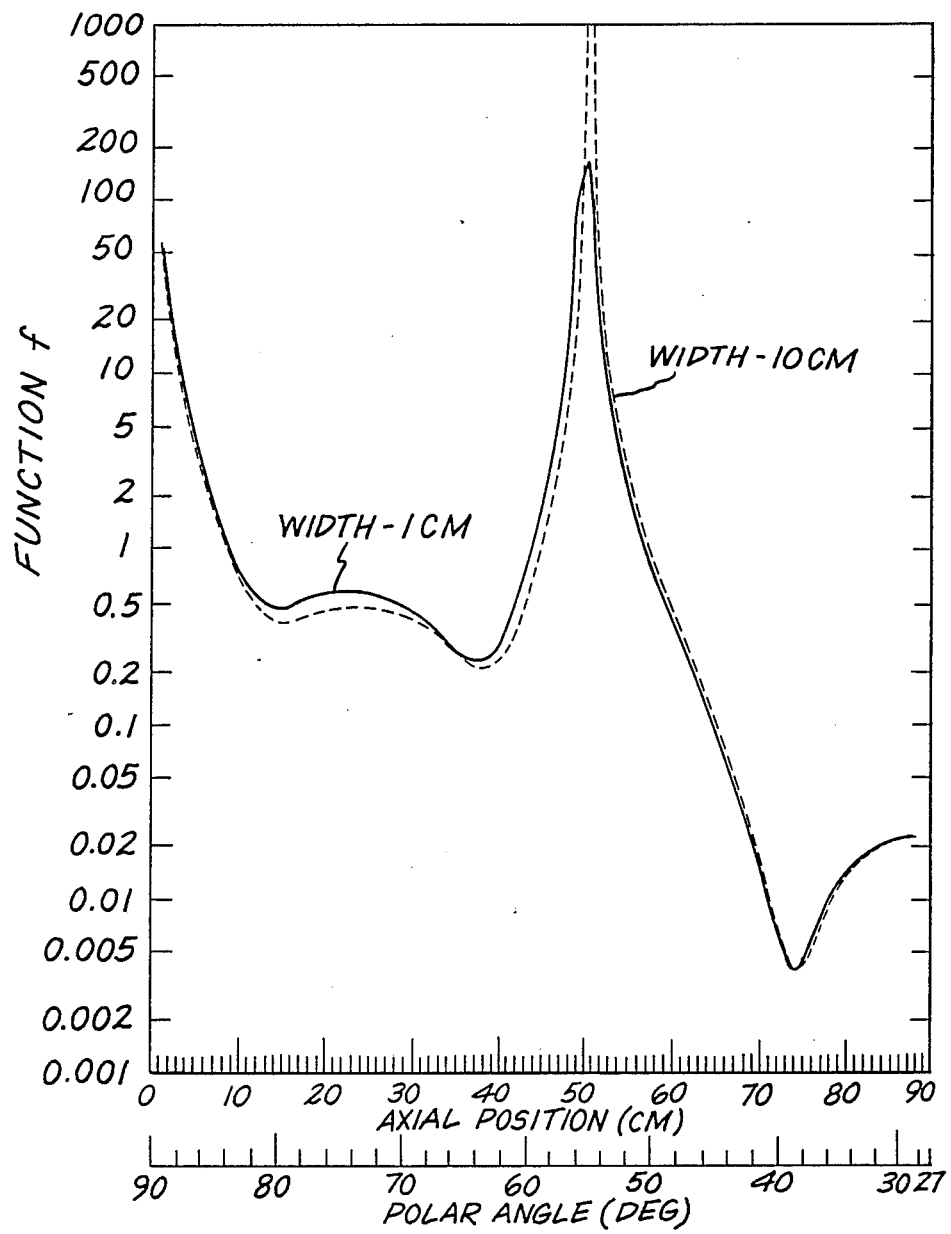
FIG. 3 is a graph showing the value of a function f (a low value of which is desirable) on a logarithmic scale versus the position of the center of the shims measured from the axial midplane to one end of the cylinder on two scales, one showing axial position for a 46 cm. radius cylindrical bore and another showing polar angle $\phi$ measured from the center of a cylindrical bore to the center of the shims.

A function f shown in equation 6 represents the squared sums of the three "lowest" error terms (lowest sum of n and m not controllable by symmetries or correction coils).

$$f = [(B_6^0(25,0,0) + (B_8^0(25,0,0))^2 + (B_5^2(25,32.9,0))^2]/(B_3^2(25,54.7,0))^2 \quad (6)$$

arguments function f are in units of cm and degrees. A low value of this function minimizes, in a least squares sense, the sum of the three error terms. A graph of the function f for a bore radius of 46 centimeters versus axial location of the center of the shim and polar angle of the center of the shim is shown in FIG. 3. The abscissa varies from 0 to 90 centimeters with the polar angle to the center of the shim on one side of the midplane varies from 90° to 27°. Note that FIG. 3 is a logarithmic plot. The graph shows a minimum at a mean axial location of 58 centimeters for a bore radius of 46 centimeters at which function f was evaluated to be 0.0044. The shim placement of the present invention can be adapted for use in different radius cylindrical bores by simply scaling the axial shim locations to the radius so that the polar angle of the shim center remains at its design value. The shape of the curve for function f relative to the polar angle does not change for different diameter cylindrical bores.

Figure 1:
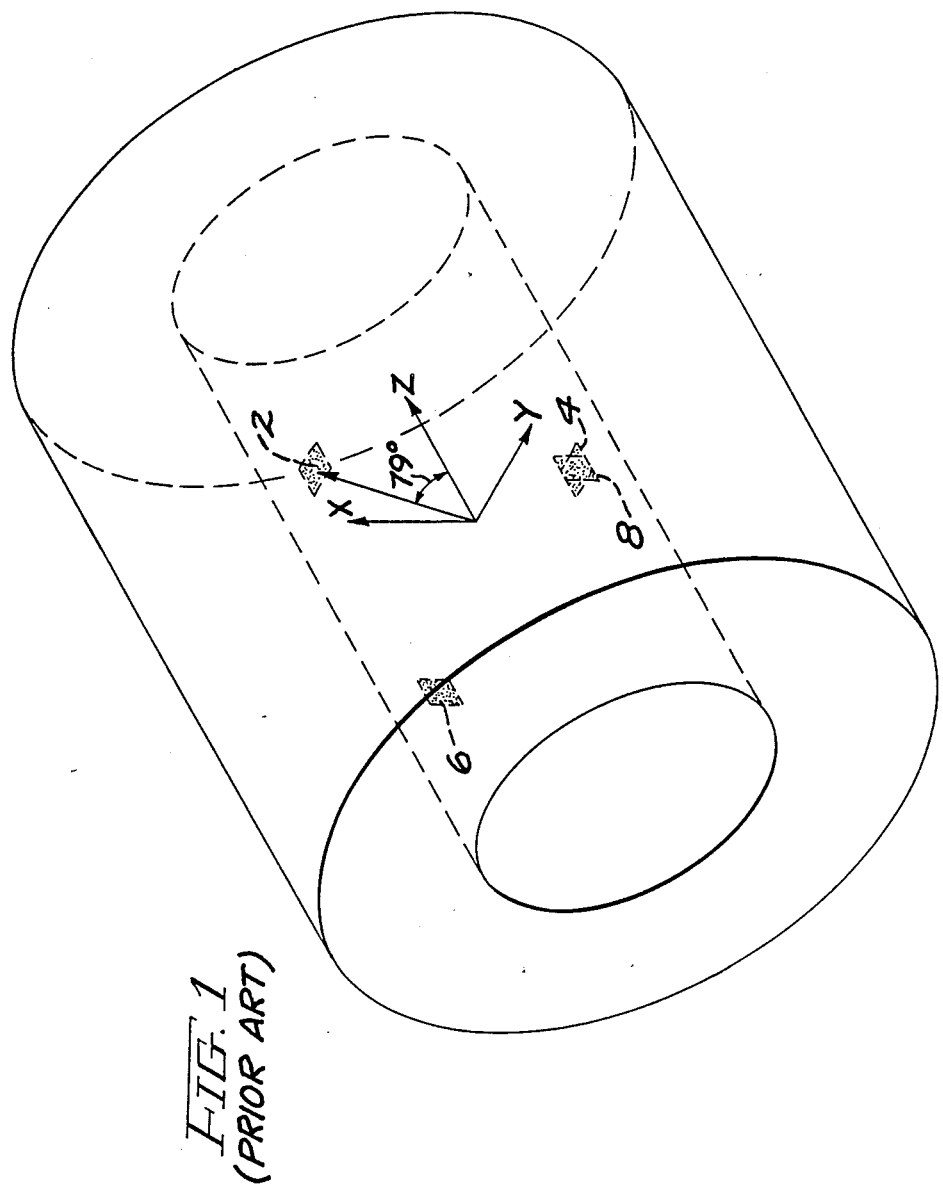
FIG. 1 is an isometric view of previously suggested positions of four shims for correcting (3,2) and (3,-2) harmonic terms, situated in the bore of a cylindrical magnet, with the cylindrical magnet shown in outline form.

The present invention and the prior art design of FIG. 1 both have steel pieces at four locations in the magnet bore. Certain geometrical features of the two designs are the same. There is a shim in both designs at some azimuthal angle $\phi$ in the z± end of the magnet with the other z± shim placed at $\phi \pm 180°$, while the shims in the z-end of the magnet are at $\phi \pm 90$ and $\phi \pm 270$, and at the same distance axially on either side of the magnet midplane. The shims 2,4,6, and 8 of FIG. 1 and the shims 21, 23, 25 and 27 of FIG. 2 differ in axial location, and their circumferential length as shown in the table below.

|  | FIG. 2 | FIG. 1 Prior Art |
| --- | --- | --- |
| shim axial length (in) | 6 | 3 |
| shim circumferential length (in) | 21 | 3 |
| shim axial location (in) | 23.25 | 3.6 |
| shim radial thickness (in) | 0.1 | 0.1 |

The harmonic terms in ppm in 1.5T field on a 50 cm sphere are:

|  | FIG. 2 | FIG. 1 (Prior Art) |
| --- | --- | --- |
| (6,0) | 1.1 | 1.6 |
| (8,0) | 1.9 | 7.2 |
| (3,2) | 49.8 | 46.7 |
| (5,2) | 1.6 | 28.9 |
| (7,2) | 1.7 | 12.2 |
| (4,4) | 3.7 | 13.2 |

Note the high content of and (5,2) and (7,2) (8,0), and (4,4) in the OMT design. These harmonics are not represented by correction coils and are therefore unshimmable. Therefore, while eliminating the (3,±/−2) terms, the OMT design creates other unshimmable terms. The net beneficial effect on magnet homogeneity in the OMT design is therefore not as pronounced.

The shims of the present invention have an axial location of about 66–86 cm and preferably 59 centimeters when a 46 centimeter radius cylindrical bore is used and have a polar angle of about 30–44° and preferably about 38°. The polar angle is independent of the particular cylindrical radius of the bore. FIG. 3 shows a dramatic valley in the function f with a magnitude of about 0.005. It is in this valley region where shim placement is desirable. Prior art shims lie at 9 centimeters, on a 46 centimeter cylinder radius and a polar angle of 79° where f is about 0.5. Therefore, the contamination inherent in the prior art design is about 70% as compared to 7% for the design of the present invention. The prior art design creates about as much high order undesirable unshimmable harmonics as it does desirable (3,2) harmonics.

The function f can be considered as a figure of merit, with the low value indicative of a relatively pure shim in a high value a contaminated one. More importantly, the magnitude of f indicates the magnitude of the contaminant harmonic terms as a fraction of the desire (3,2) term. Since the dividend and the devisor are both squared, a function value of 0.5 indicates a contamination of about 70%. The contamination are all high order terms which cannot be eliminated with correction coils after the passive shims are placed in the core of the magnet.

Figure 4:
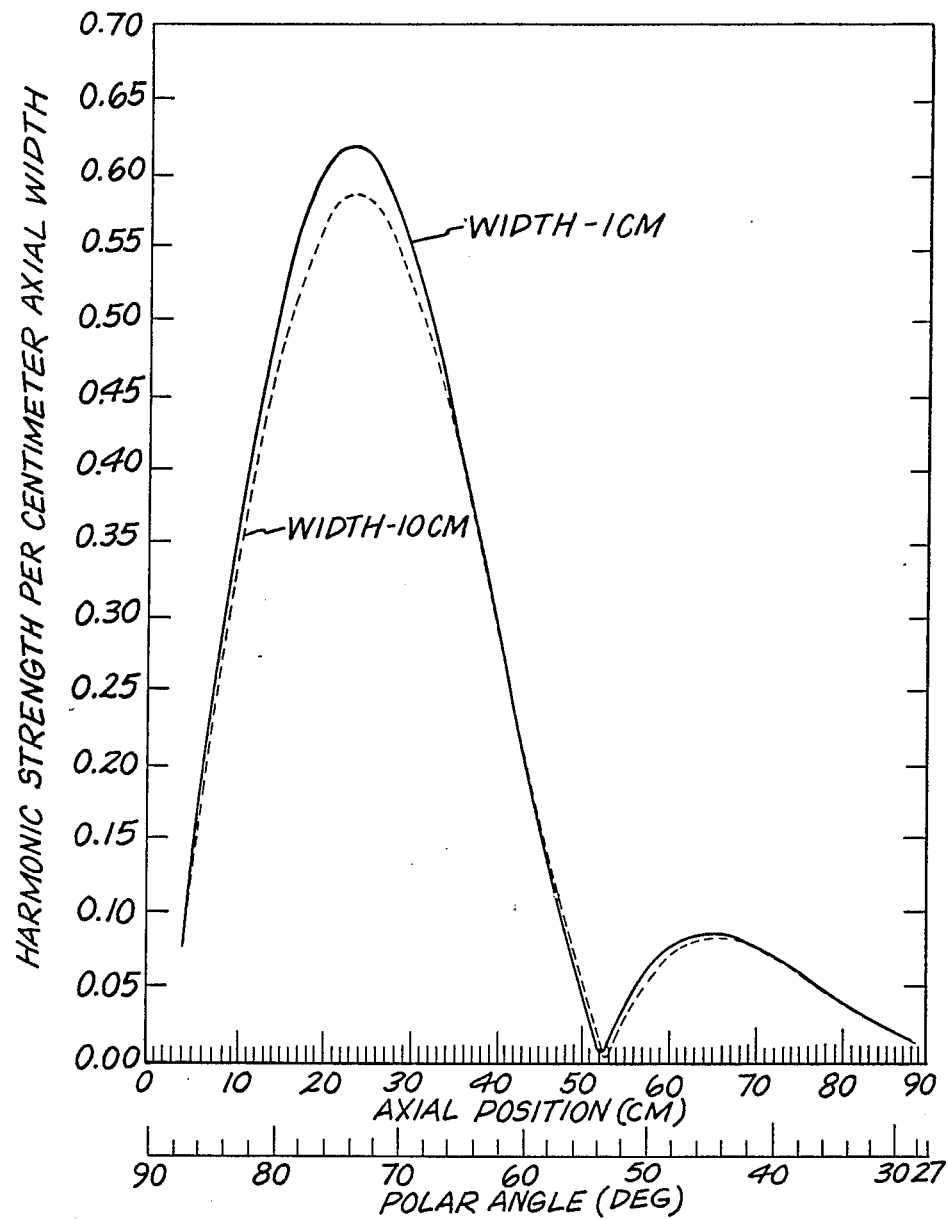
FIG. 4 is a graph showing peak (3, 2) harmonic strength per centimeter of axial shim width measured in Gauss on a 25 cm radius sphere in the bore of a 1.5T magnet of shims having a width of 1 cm. and 10 cm. versus the position of the center of the shims measured from the axial midplane to one end of the cylinder on two scales, one showing axial position for a 46 cm radius cylindrical bore, another showing polar angle measured from the center of cylinder to the center of the shims.

Referring now to FIG. 4, the peak magnitude of the (3,2) in Gauss term produced by a set of shims per centimeter of axial width is shown for a 1 centimeter and a 10 centimeter axial width shims for different axial locations of the center of the shim for a shim cylindrical radius of 46 centimeters and their equivalent polar angles. The shims have a thickness of 0.1 and subtend an angle of 90° azimuthally. The prior art design which is positioned at 9 centimeters and a polar angle of 79° produces more (3,2) harmonics for the amount of shim used. The cost in fabricating larger shims from steel shimming stock is marginal and the resulting design in the present invention using larger shims at a polar angle of 30–44° and especially 38° results in a significant improvements in the overall homogeneity of the magnet being shimmed.

Four steel shims in FIG. 2 all lie at the same spherical radius and subtend the same azimuthal angle and polar angle. The subtended polar angle is a function of the shim axial width which in a preferred embodiment is 6 inches (the roll width of standard low carbon steel shim stock). Resulting in a subtended polar angle of 7.1° at a radius of 46 centimeters. As shown in FIG. 3, a change in the axial width from 1 cm. to 10 cm. does not substantially affect the value of function f and therefor the selection of the axial width does not have much affect on the shim purity. FIG. 4 shows that as the shim gets wider the effect per centimeter of producing the desired (3,2) harmonic is slightly reduced.

|  | $\phi$ | $\theta$ | $\Delta\theta$ | $\Delta\phi$ |
|---|---|---|---|---|
| Shim 21 | $0 + \phi$ | 38 | 7.1 | 90 |
| Shim 23 | $180 + \phi$ | 38 | 7.1 | 90 |
| Shim 25 | $90 + \phi$ | 180–38 | 7.1 | 90 |
| Shim 27 | $270 + \phi$ | 180–38 | 7.1 | 90 |

The azimuthal angle $\phi$ and polar angle $\theta$ are those of the shim center. Note that a phase angle $\phi_o$ is included in the locations; this phase angle is a function of the relative magnitude of the (3,2) and (3,−2) harmonic terms which must be shimmed.

The azimuthal angle subtended by each shim, $\Delta\phi$, can be varied. The amount of a harmonic of order m produced by a shim with $\phi=0$ is proportional to sin (m $\Delta\phi/2$). A shim set with proper symmetry to produce m=2 terms also create m=4, 6, 8, etc. So the m=4 terms are next highest order, and thus have the largest magnitude of the contaminants (except for the m=0 terms, which can't be avoided). These terms are eliminated for $\Delta\phi=90$ and maximum at $\Delta\phi=45$. From the above relation, it is also evident that the choice of $\Delta\phi=90$ maximizes the amount of the desired m=2 term, as sin(2(90)/2)=1.

Figure 5:
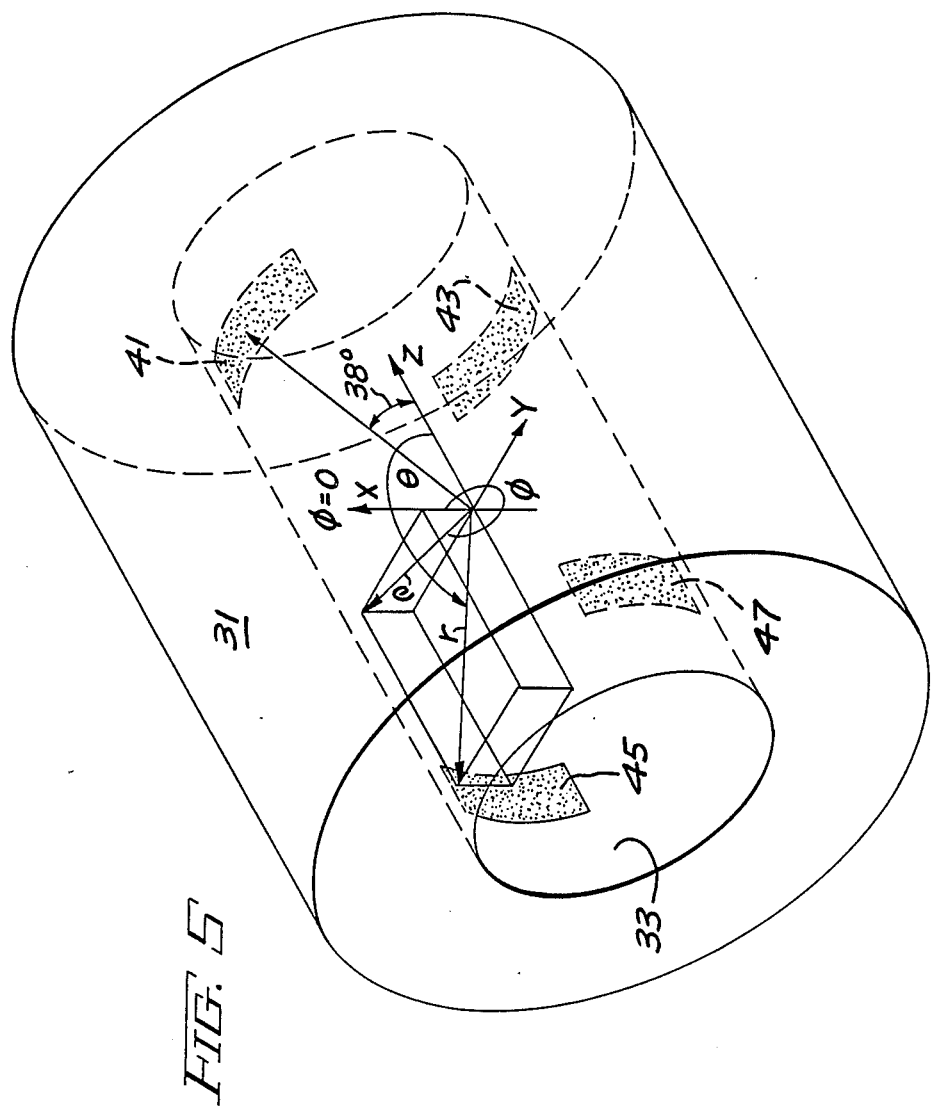
FIG. 5 is an isometric view of four shims positioned in accordance with another embodiment of the present invention for correcting (3,2) and (3,-2) harmonic terms, in the bore of a cylindrical magnet, with the cylindrical magnet shown in outline form.

Referring now to FIG. 5, another embodiment of the present invention is shown. Shims 41, 43, 45 and 47 are shown in the bore 33 of a magnet 31 of the same dimensions as the magnet of FIG. 2. Shims 41, 43, 45 and 47 have their centers situated in the same locations as shims 21, 23, 25 and 27, respectively, of FIG. 2. The difference between the shims of FIG. 5 are compared to the shims of FIG. 2 in that the azimuthal angle $\Delta\phi$ subtended by each shim in FIG. 5 is 66.4° rather than the $\Delta\phi$ of 90° for FIG. 2. The shims of FIG. 5 having a reduced circumferential extent, represent a tradeoff. The tradeoff is made primarily for convenience in shim size and handling and because the amount of m=4 produced by such a set of shims is inconsequential for a typical amount of (3,2) required. If elimination of all m=4 terms were essential, a $\Delta\phi$ of 90° would be chosen as shown in the embodiment of FIG. 2. As in FIG. 2, a polar angle of about 38° between the axial centerline and the center of shims is preferred with angles of about 30°–44° being acceptable.

Figure 6:
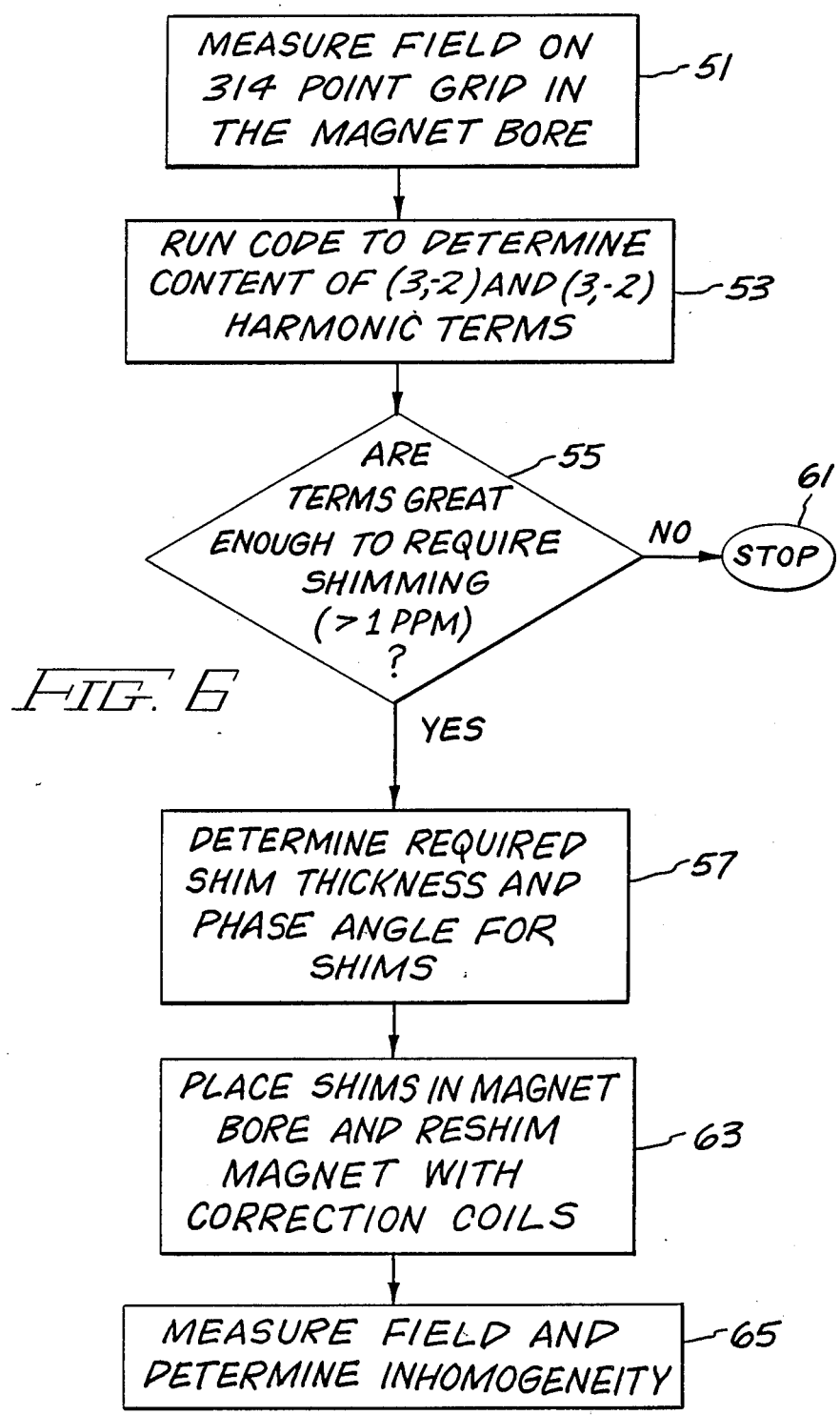
FIG. 6 is a flow chart showing the steps in determining the thickness and amount of azimuthal rotation needed for correcting a specific shimming situation.

In order to use the shim set of either FIG. 2 or FIG. 5 in a magnet, the azimuthal angle and the shim thicknesses must be determined. This is accomplished as shown in the flow diagram of FIG. 6. The first step shown in block 51 is to determine the field in the magnet to be shimmed. The field is measured by 314 points over an imaginary grid centered in the bore of the magnet. The grid comprises 13 circles coaxial with the axial centerline of the cylindrical bore, with the 13 circles evenly spaced over 20 centimeters on either side of the midplane of the cylinder with one of the circles lying in the cylindrical midplane of z=0. Each circle has a 15 centimeter radius and 24 points evenly spaced circumferentially about the circle where the field is measured. Two additional points are measured on the axis 20 centimeters on either side of the midplane. The field data is analyzed by block 53 producing the least squares fit of the measured field data at each field measuring point to 81 harmonic terms (0,0) through (8,8) inclusively. The degree n must be greater than or equal to the absolute value of the order m. The terms are fit to the measured data so that the sum of the squares of the differences between the field produced by all of the harmonic terms and the measured field at each field measurement point is minimized.

The equations which must be solved can be put into a matrix form in the following manner. The idea is to find the combination of harmonic shapes which most closely approximates the actual field shape in at least squares sense. This is done by minimizing the least squares error function. First assume T field measurement points and H harmonic terms. Each harmonic may be represented by its value at the T pints measured. The field $B_h(r_t)$ from harmonic h at a point $r_t$ is linear with harmonic strength $C_h$ and dependent on $r_t$ in some specific way related to the harmonic shape, and can be expressed as $$B_h(r_t) = K_h(r_t) * C_h \tag{7}$$

where $K_h(r_t)$ is the function which gives the magnitude of harmonic h at point $r_t$ for a unit harmonic strength. The error function can be expressed as a sum of the squares of the difference between the measured field $B(r_t)$ and the sum of all the harmonic fields or $$E = \sum_{t=1}^{T} \left\{ B(r_t) - \sum_{h=1}^{H} B_h(r_t) \right\}^2 \tag{8}$$

Now substituting in the functional dependence on harmonic strength $C_h$ from (7), we obtain $$E = \sum_{t=1}^{T} \left\{ B(r_t) - \sum_{h=1}^{H} K_h(r_t) C_h \right\}^2 \tag{9}$$

This least squares error function is then minimized by taking its derivative with respect to each harmonic strength coefficient $C_h$ and setting it to zero. There are H such derivatives to be taken, and the resulting H equations may be expressed indicially as $$\frac{\partial E}{\partial C_j} = -2 \sum_{t=1}^{T} \left\{ \left[ B(r_t) - \sum_{h=1}^{H} K_t(r_t) C_t \right] K_j(r_t) \right\} = 0 \tag{10}$$

Putting these H equations into a matrix form allows simultaneous solution for the harmonic strengths $C_j$ which minimize the error function and thus provide the best fit, in a least squares sense, to the measured data.

The contents of the (3,2) and (3,−2) terms in the overall field are field are checked in decision block 55 and if greater than 1 ppm the shim thickness and phase angle for the shims are determined in block 57. The magnitude of the (3,2) term produced by the shims of the present invention is 49.8 ppm for a 0.1″ shims or 0.5 ppm per mil of shim thickness. If A equals the magnitude of the (3,2) term and B equals the magnitude of the (3,−2) term then the thickness of each of the four shims is given by $$\text{thickness} = (A^2 \pm B^2)/(0.5 \text{ ppm/mil}) \quad (11)$$

The phase angle $\phi_o$ is then determined by the relative magnitude of A and B, as follows $$\alpha = \tan(-B/A) \quad (12)$$

$$\text{if } A > 0, \phi_o = 90 - \alpha/2 \quad (13)$$

$$\text{if } A < 0, \phi_o = -\alpha/2. \quad (14)$$

If the (3,2) and (3,−2) harmonics are found to be less than 1 ppm in decision block 55 passive shimming is not needed and nothing further is done upon reaching block 61.

If shims are needed, appropriate thickness shims are situated at the appropriate angle as determined in block 57 and the magnet reshimmed using the magnet correction coils in block 63. The field is again measured with the passive shims in place and the adjusted correction coils in block 65 to determine the total magnet inhomogeneity.

The foregoing has described a simple and reliable means for creating an arbitrary combination of (3,2) and (3,−2) harmonic terms without the creation of higher order harmonic contaminants.

While the invention has been particularly shown and described with reference to several preferred embodiments thereof, it will be understood by those skilled in the art that various changes in form and detail may be made without departing from the spirit and scope of the invention.

What I claim is:

1. A shim set for passively shimming (3,2) and (3,−2) harmonic terms in the field of a magnetic resonance magnet having a cylindrical bore, comprising:
   four shims of ferromagnetic material, each of said shims being the same size and secured to the cylindrical bore of the magnet, each of the shims being longer than they are wide, the first two of said shims being situated diametrically opposite one another towards one end of the cylindrical bore, with the length of each of the shims extending circumferentially, one of the first two shims being situated to create a polar angle between the axial centerline of the cylindrical bore and a line passing through the center of the cylindrical bore and the center bf the first of the two shims, of about 30-44°, the second two of the four shims symmetrically positioned about the midplane of the cylinder relative to the first two shims and then rotated 90°.

2. The shim set of claim 1 wherein the polar angle created between the axial centerline of the cylindrical bore and a line passing through the center of the cylindrical bore and the center of the first of the two shims is about 38°.

3. The shim set of claim 1 wherein the circumferential extent of each of the shims is about 90°.

4. The shim set of claim 2 wherein the circumferential extent of each of the shims is about 90°.

5. The shim set of claim 1 wherein the circumferential extent of each of the shims is about 66°.

6. The shim set of claim 2 wherein the circumferential extent of each of the shims is about 66°.

7. A shim set for passively shimming (3,2) and (3,−2) harmonic terms in the field of a superconducting magnetic resonance magnet having a cylindrical bore and correction coils, comprising:
   four shims of ferromagnetic material, each of said shims being the same size and secured to the cylindrical bore of the magnet, each of the shims being longer than they are wide, the first two of said shims being situated diametrically opposite one another towards one end of the cylindrical bore, with the length of each of the shims extending circumferentially, one of the first two shims being situated to create a polar angle between the axial centerline of the cylindrical bore and a line passing through the center of the cylindrical bore and the center of the first of the two shims, of about 30-44°, the second two of the four shims symmetrically positioned about the midplane of the cylinder relative to the first two shims and then rotated 90°.

8. The shim set of claim 7 wherein the polar angle created between the axial centerline of the cylindrical bore and a line passing through the center of the cylindrical bore and the center of the first of the two shims is about 38°.

9. The shim set of claim 7 wherein the circumferential extent of each of the shims is about 90°.

10. The shim set of claim 8 wherein the circumferential extent of each of the shims is about 90°.

11. The shim set of claim 7 wherein the circumferential extent of each of the shims is about 66°.

12. The shim set of claim 8 wherein the circumferential extent of each of the shims is about 66°.

* * * * *